US009350331B2

United States Patent
Cyrusian

(10) Patent No.: US 9,350,331 B2
(45) Date of Patent: May 24, 2016

(54) HIGH SPEED LATCH WITH OVER VOLTAGE PROTECTION AND INTEGRATED SUMMING NODES

(71) Applicant: Marvell World Trade LTD., St. Michael (BB)

(72) Inventor: Sasan Cyrusian, Scotts Valley, CA (US)

(73) Assignee: Marvell World Trade Ltd., St. Michael (BB)

( * ) Notice: Subject to any disclaimer, the term of this patent is extended or adjusted under 35 U.S.C. 154(b) by 54 days.

(21) Appl. No.: 14/210,644

(22) Filed: Mar. 14, 2014

(65) Prior Publication Data

US 2014/0268450 A1    Sep. 18, 2014

Related U.S. Application Data

(60) Provisional application No. 61/783,776, filed on Mar. 14, 2013.

(51) Int. Cl.
| | |
|---|---|
| *H02H 3/00* | (2006.01) |
| *H03K 3/037* | (2006.01) |
| *H02H 3/20* | (2006.01) |
| *H02K 5/24* | (2006.01) |
| *H02H 9/04* | (2006.01) |
| *H02H 7/125* | (2006.01) |

(52) U.S. Cl.
CPC ............... *H03K 3/0375* (2013.01); *H02H 3/20* (2013.01); *H02K 5/24* (2013.01); *H02H 7/1252* (2013.01); *H02H 9/04* (2013.01); *H02H 9/046* (2013.01)

(58) Field of Classification Search
CPC .................... H03K 17/0822; H03K 19/00315; H02H 3/202; H01L 27/0266; H02M 1/32
USPC ............................................. 361/91.1, 86–87
See application file for complete search history.

(56) References Cited

U.S. PATENT DOCUMENTS 6,014,042 A     1/2000 Nguyen
6,665,358 B1 *  12/2003 Odagiri .......................... 375/343
(Continued)

FOREIGN PATENT DOCUMENTS

EP         0363332 A2     4/1990

OTHER PUBLICATIONS

Balamurugan, Ganesh et al., "Modeling and Analysis of High-Speed I/O Links," IEEE Transactions on Advanced Packaging, May 1, 2009, vol. 32, No. 2, pp. 237-247.

(Continued)

*Primary Examiner* — Danny Nguyen

(57) ABSTRACT

A latch includes a current source, an input amplifier, and a latch output circuit. The current source is configured to output a current based on a voltage source. The input amplifier is configured to receive a differential analog input signal including a first differential input and a second differential input and selectively provide the current based on the first differential input and the second differential input. A latch output circuit is configured to selectively output a differential digital output signal including a first differential output and a second differential output. The latch output circuit includes an over voltage protection circuit configured to receive the current output from the input amplifier, receive the voltage source limit, and output a modified differential digital output signal based on a comparison between a voltage corresponding to each of the first differential output and the second differential output and the voltage source limit.

15 Claims, 6 Drawing Sheets

(56) References Cited

U.S. PATENT DOCUMENTS

| | | |
|---|---|---|
| 6,788,116 B1 | 9/2004 | Cook et al. |
| 8,779,958 B1 * | 7/2014 | Maurino et al. .............. 341/144 |
| 9,059,874 B2 | 6/2015 | Cyrusian |
| 2003/0141912 A1 | 7/2003 | Sudjian |
| 2005/0212599 A1 | 9/2005 | Lin et al. |
| 2006/0176040 A1 * | 8/2006 | Kernahan et al. ............. 323/299 |
| 2007/0197265 A1 | 8/2007 | Park et al. |
| 2009/0224806 A1 | 9/2009 | Huang et al. |
| 2010/0046597 A1 | 2/2010 | Farjad-rad |
| 2014/0050260 A1 | 2/2014 | Cyrusian |

OTHER PUBLICATIONS

International Search Report and Written Opinion for PCT/IB2013/001752 mailed Feb. 21, 2014, 16 pages.

International Search Report and Written Opinion for PCT/US2014/028434 mailed Jun. 27, 2014, 14 pages.

Riedlinger, Reid et al., "A 32 nm, 3.1 Billion Transistor, 12 Wide Issue Itanium Processor for Mission-Critical Servers," IEEE Journal of Solid-State Circuits, Jan. 1, 2012, vol. 47, No. 1, pp. 177-193.

Toifl, Thomas et al., "A 2.6 mW/Gbps 12.5 Gbps RX With 8-Tap Switched-Capacitor DFE in 32 nm CMOS," IEEE Journal of Solid-State Circuits, Apr. 1, 2012, vol. 47, No. 4, pp. 897-910.

* cited by examiner

HIGH SPEED LATCH WITH OVER VOLTAGE PROTECTION AND INTEGRATED SUMMING NODES

CROSS-REFERENCE TO RELATED APPLICATIONS

This application claims the benefit of U.S. Provisional Application No. 61/783,776, filed on Mar. 14, 2013. This application is related to U.S. patent application Ser. No. 13/962,900, filed on Aug. 8, 2013. The entire disclosures of the applications referenced above are incorporated herein by reference.

FIELD

The present disclosure relates to a receiver path of a communication interface, and more particularly to systems and methods for providing a high speed latch with over voltage protection in the receiver path.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A signal path between a transmitter and a receiver (e.g., a receiver path of a serial data interface) includes a communication channel. For example, the serial data interface may be a high speed serial data interface. A signal transmitted via the communication channel may be modified by noise, interference, and/or frequency-dependent attenuation and dispersion. Frequency-dependent attenuation can introduce distortions into the transmitted signal. For example, the distortions may include inter-symbol interference (ISI) and jitter. The distortions may cause errors in the signal as received by the receiver.

The communication channel may be implemented using differential signaling. Differential signaling can reduce the effects of some forms of interference, such as common mode noise. Equalizers such as Continuous Time Linear Equalizers (CTLEs) may be used in communication channels to partially compensate for channel attenuation. A CTLE may be implemented as a differential amplifier with a fixed or programmable frequency dependent degeneration feature. The CTLE may be followed by a summing node and a high-speed latch in the communication channel.

FIG. 1 shows a receiver path 100 (e.g., of a serial data receiver) including a communication channel 104, an equalizer 108, a sampler 112, a summer 116, a decision feedback estimation (DFE) module 120, and a high-speed latch 124. The equalizer 108 may be, for example, a switched continuous time linear equalizer (CTLE) or a switched CTLE with an integrated sampler.

The equalizer 108 receives an input signal 128 via the communication channel 104 and generates an output signal 132. Each of the input signal 128 and the output signal 132 may include a differential signal pair. The equalizer 108 performs equalization on the input signal 128 to generate the output signal 132. For example, the equalizer 108 may include a differential amplifier.

The input signal 128 received from the communication channel 104 may include attenuation (e.g., frequency dependent attenuation). For example, the frequency dependent attenuation caused by skin effect and dielectric loss, which are two possible sources of attenuation in the communication channel 104, is proportional to a square root of a frequency and the frequency, respectively. The equalizer 108 compensates for any attenuation in the input signal 128 to generate the output signal 132.

The sampler 112 samples the output signal 132 to generate a sampled signal 136. The summer 116 receives the sampled signal 136 and an output 140 of the DFE module 120. For example, the summer 116 may add one or more signals corresponding to a digital output 144 of the high-speed latch 124 to the sampled signal 136 or subtract one or more signals from the sampled signal 136. The high-speed latch 124 receives an output 148 of the summer 116 and determines a digital value corresponding to the input signal 128. Accordingly, the digital output 144 of the high-speed latch 124 is, for example, a digital high (e.g., "1") or a digital low (e.g., "0"). In some implementations, the high-speed latch 124 may determine a multi-bit digital value that corresponds to the input signal 128 and generate a corresponding multi-bit digital output 144. In some implementations, the summer 116 and the DFE module 120 may be omitted and the equalizer 108 is instead connected directly to the slicer high-speed latch 124

FIG. 2 shows a high-speed latch 200. The latch 200 receives a differential analog input signal 204 (e.g., differential inputs 204-1 and 204-2 corresponding to the output 148 as shown in FIG. 1) and generates a differential digital output signal 208 (e.g., differential outputs 208-1 and 208-2 corresponding to the digital output 144 as shown in FIG. 1). For example, an input amplifier 212 receives the analog input signal 204. A tail current source 216 outputs a current based on, for example, a first bias voltage 220 and a second bias voltage 224, and a voltage source 228. The input amplifier 212 selectively provides current to an output circuit 232 based on the current received from the tail current source 216 and the analog input signal 204. The output circuit 232 generates the digital output signal 208 based on the current received from the input amplifier 212. The output circuit 232 may include a reset node 236 for resetting the output circuit 232.

SUMMARY

A latch includes a current source configured to output a current based on a voltage source. An input amplifier is configured to receive a differential analog input signal including a first differential input and a second differential input, and selectively provide the current output by the current source based on the first differential input and the second differential input. A latch output circuit is configured to selectively output, based on the current received from the input amplifier and a voltage source limit, a differential digital output signal including a first differential output and a second differential output. The latch output circuit includes an over voltage protection circuit configured to receive the current output from the input amplifier, receive the voltage source limit, and output a modified differential digital output signal based on a comparison between a voltage corresponding to each of the first differential output and the second differential output and the voltage source limit.

In other features, the over voltage protection circuit includes a first transistor in communication with the current received from the input amplifier, the voltage source limit, and the first differential output, and a second transistor in communication with the current received from the input amplifier, the voltage source limit, and the second differential output. If the first differential output is less than the voltage source limit, the first differential output corresponds to the current received from the input amplifier. If the first differential output is greater than the voltage source limit, the first transistor is configured to limit the first differential output according to the voltage source limit. If the second differential output is less than the voltage source limit, the second differential output corresponds to the current received from the input amplifier. If the second differential output is greater than the voltage source limit, the second transistor is configured to limit the second differential output according to the voltage source limit.

In other features, a switch circuit is configured to provide an output signal based on an output of a digital-to-analog converter (DAC). An integrated summing node is arranged between the input amplifier and the latch output circuit. The integrated summing node is configured to combine the current provided by the input amplifier and the output signal provided by the switch circuit.

A method of operating a latch includes outputting, from a current source, a current based on a voltage source, receiving a differential analog input signal including a first differential input and a second differential input, selectively providing, from an input amplifier, the current output by the current source based on the first differential input and the second differential input, selectively outputting, based on the current received from the input amplifier and a voltage source limit, a differential digital output signal including a first differential output and a second differential output, and outputting a modified differential digital output signal based on a comparison between a voltage corresponding to each of the first differential output and the second differential output and the voltage source limit.

In other features, if the first differential output is less than the voltage source limit, the first differential output corresponds to the current received from the input amplifier. If the first differential output is greater than the voltage source limit, the first differential output is limited according to the voltage source limit. If the second differential output is less than the voltage source limit, the second differential output corresponds to the current received from the input amplifier. If the second differential output is greater than the voltage source limit, the second differential output is limited according to the voltage source limit.

In other features, the method includes providing an output signal based on an output of a digital-to-analog converter (DAC) and combining the current provided by the input amplifier and the output signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

A signal path according to the principles of the present disclosure includes a high-speed latch having an over voltage protection circuit. The over voltage protection circuit receives a voltage source limit and limits an output voltage of the high-speed latch based on the voltage source limit. Accordingly, the over voltage protection circuit allows operation of thin oxide devices in the high-speed latch using a high power supply voltage.

Figure 3:
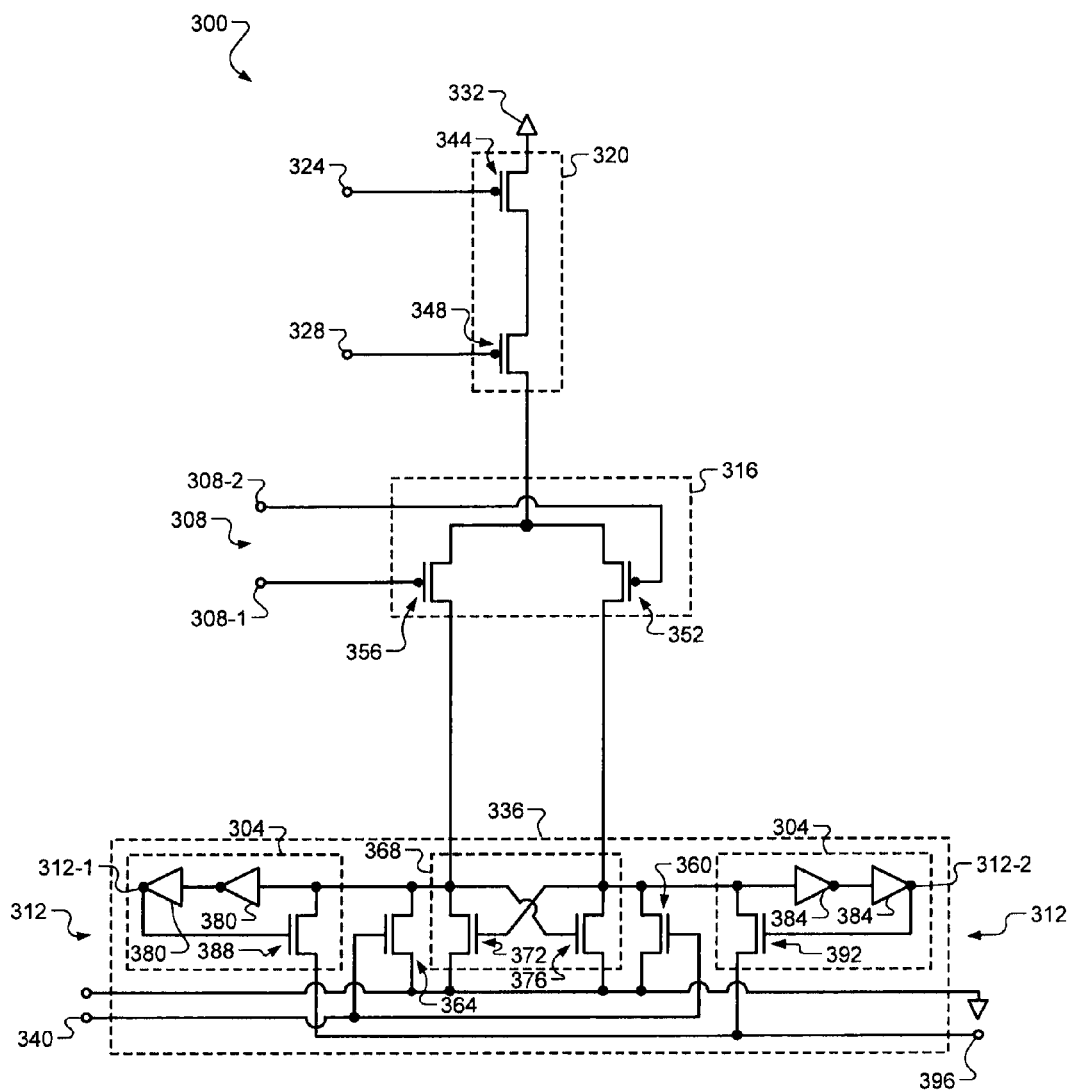
FIG. 3 illustrates a first example high-speed latch according to the principles of the present disclosure.

FIG. 3 shows an example high-speed latch 300 including an over voltage protection circuit 304. The latch 300 receives a differential analog input signal 308 (e.g., differential inputs 308-1 and 308-2) and generates a differential digital output signal 312 (e.g., differential outputs 312-1 and 312-2). For example, an input amplifier 316 receives the analog input signal 308. A tail current source 320 outputs a current based on, for example, a first bias voltage 324 and a second bias voltage 328, and a voltage source 332. The input amplifier 316 selectively provides current to an output circuit 336 based on the current received from the tail current source 320 and the analog input signal 308. The output circuit 336 generates the digital output signal 312 based on the current received from the input amplifier 316. The output circuit 336 may include a reset node 340 for resetting the output circuit 336.

The tail current source 320 includes switches (e.g., transistors) 344 and 348. The input amplifier 316 includes switches (e.g., transistors) 352 and 356. The output circuit 336 includes switches (e.g., transistors) 360 and 364 and a positive feedback circuit 368. The positive feedback circuit includes a cross-coupled pair of transistors 372 and 376, which provide feedback corresponding to the digital output signal 312.

The over voltage protection circuit 304 includes buffer amplifiers 380, buffer amplifiers 384, transistor 388, and transistor 392. The buffer amplifiers 380 receive a current according to the differential input 308-1. Conversely, the buffer amplifiers 384 receive a current according to the differential input 308-2. The buffer amplifiers 380 and 384 together provide the digital output signal 312.

The transistors 388 and 392 each receive a voltage source limit 396 and respective ones of the differential outputs 312-1 and 312-2. The transistors 388 and 392 prevent the digital output signal 312 from increasing above the voltage source limit 396. For example, if the differential output 312-1 is less than the voltage source limit 396, then the transistor 388 is OFF and the differential output 312-1 corresponds directly to the current received from the input amplifier 316 (which is based on the voltage source 332). Similarly, if the differential output 312-2 is less than the voltage source limit 396, then the transistor 392 is OFF and the differential output 312-2 corresponds directly to the current received from the input amplifier 316.

Conversely, if the differential output 312-1 is greater than the voltage source limit 396, then the transistor 388 is ON and a portion of the current received from the input amplifier 316 is directed through the transistor 388. Similarly, if the differential output 312-2 is greater than the voltage source limit 396, then the transistor 392 is ON and a portion of the current received from the input amplifier 316 is directed through the transistor 392. In this manner, the over voltage protection circuit 304 prevents the digital output signal 312 from exceeding the voltage source limit 396 regardless of a voltage of the voltage source 332. Accordingly, a high power supply voltage can be used to provide the voltage source 332.

Figure 4:
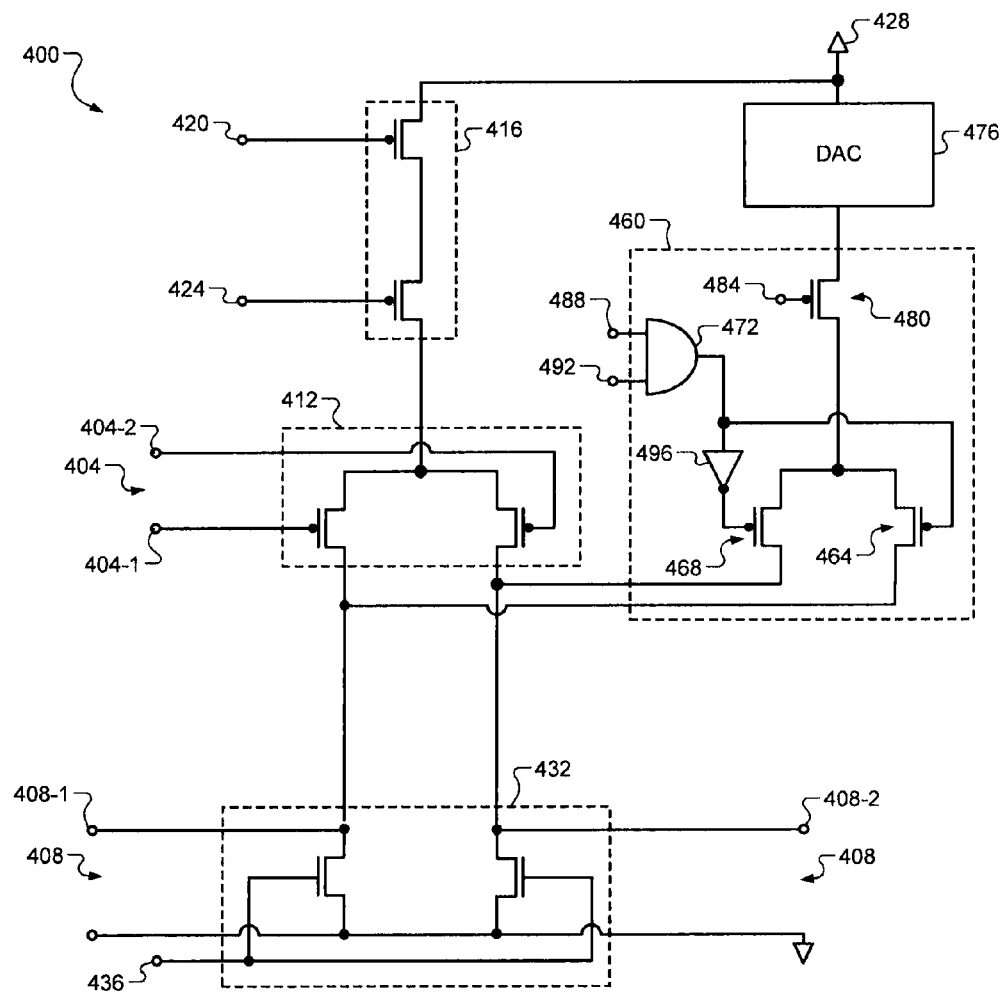
FIG. 4 illustrates a second example high-speed latch according to the principles of the present disclosure.

FIG. 4 shows another example high-speed latch 400. The latch 400 receives a differential analog input signal 404 (e.g., differential inputs 404-1 and 404-2) and generates a differential digital output signal 408 (e.g., differential outputs 208-1 and 208-2). For example, an input amplifier 412 receives the analog input signal 404. A tail current source 416 outputs a current based on a first bias voltage 420, a second bias voltage 424, and a voltage source 428. The input amplifier 412 selectively provides current to an output circuit 432 based on the current received from the tail current source 416 and the analog input signal 404. The output circuit 432 generates the digital output signal 408 based on the current received from the input amplifier 412. The output circuit 432 may include a reset node 436 for resetting the output circuit 432.

Figure 1:
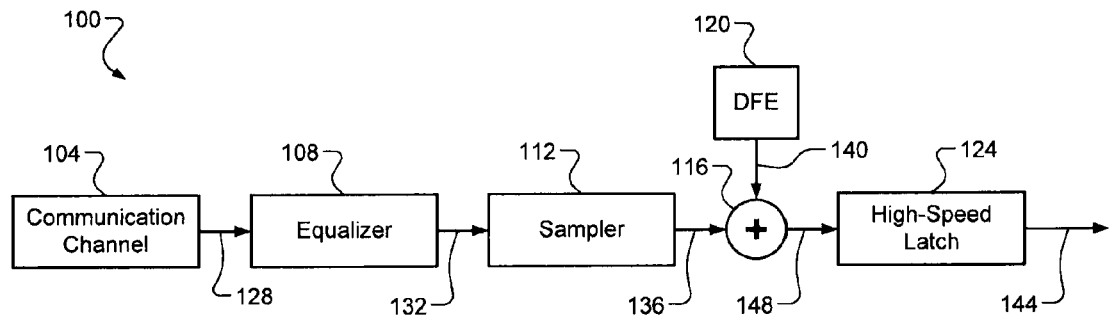
FIG. 1 is a functional block diagram of an example receiver path.
Figure 2:
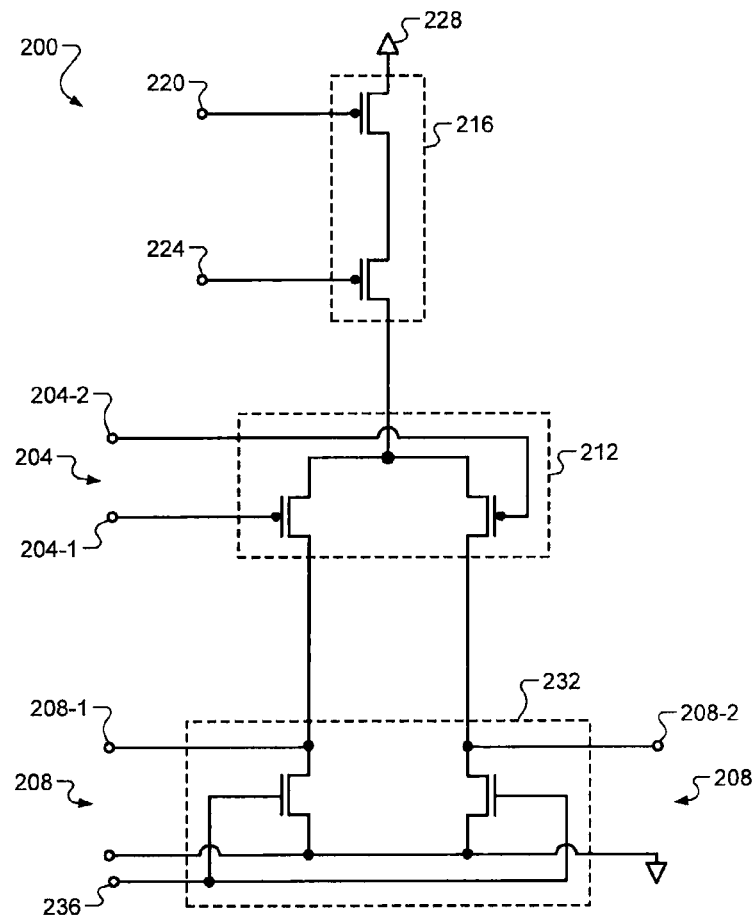
FIG. 2 illustrates an example high-speed latch.

The latch 400 also includes a high-speed switch circuit 460. The switch circuit 460 includes high-speed switches 464 and 468. The switches 464 and 468 communicate with an output of a digital XOR circuit 472 and an output of a digital-to-analog converter (DAC) 476. For example, the DAC 476 may be a current mode or resistive DAC and corresponds to DACs within the DFE module 120 as shown in FIG. 1. A switch 480, connected between the DAC 476 and the switches 464 and 468, receives a third bias voltage 484. Outputs of the switches 464 and 468 are connected to outputs of the input amplifier 412.

The digital XOR circuit 472 receives inputs 488 and 492 and generates an output accordingly. The input 492 corresponds to $D_{-3}$, or data received three clock cycles prior to the data that is sampled at a next clock edge, and the input 488 corresponds to a sign (i.e., + or −) of a coefficient of the input 492, where the DFE module 120 of FIG. 1 provides, at the summer 116, $V_{in} + \Sigma_{n=1}^{N}(F_n D_{-n})$, where N is a positive integer (e.g., between 2 and 20), and where $F_n$ corresponds to a digital code provided at an input of correspond ones of the DACs of the DFE module 120. The switch 464 receives the output of the digital XOR circuit 472 and the switch 468 receives the output of the digital XOR circuit 472 as inverted by inverter 496.

Figure 5:
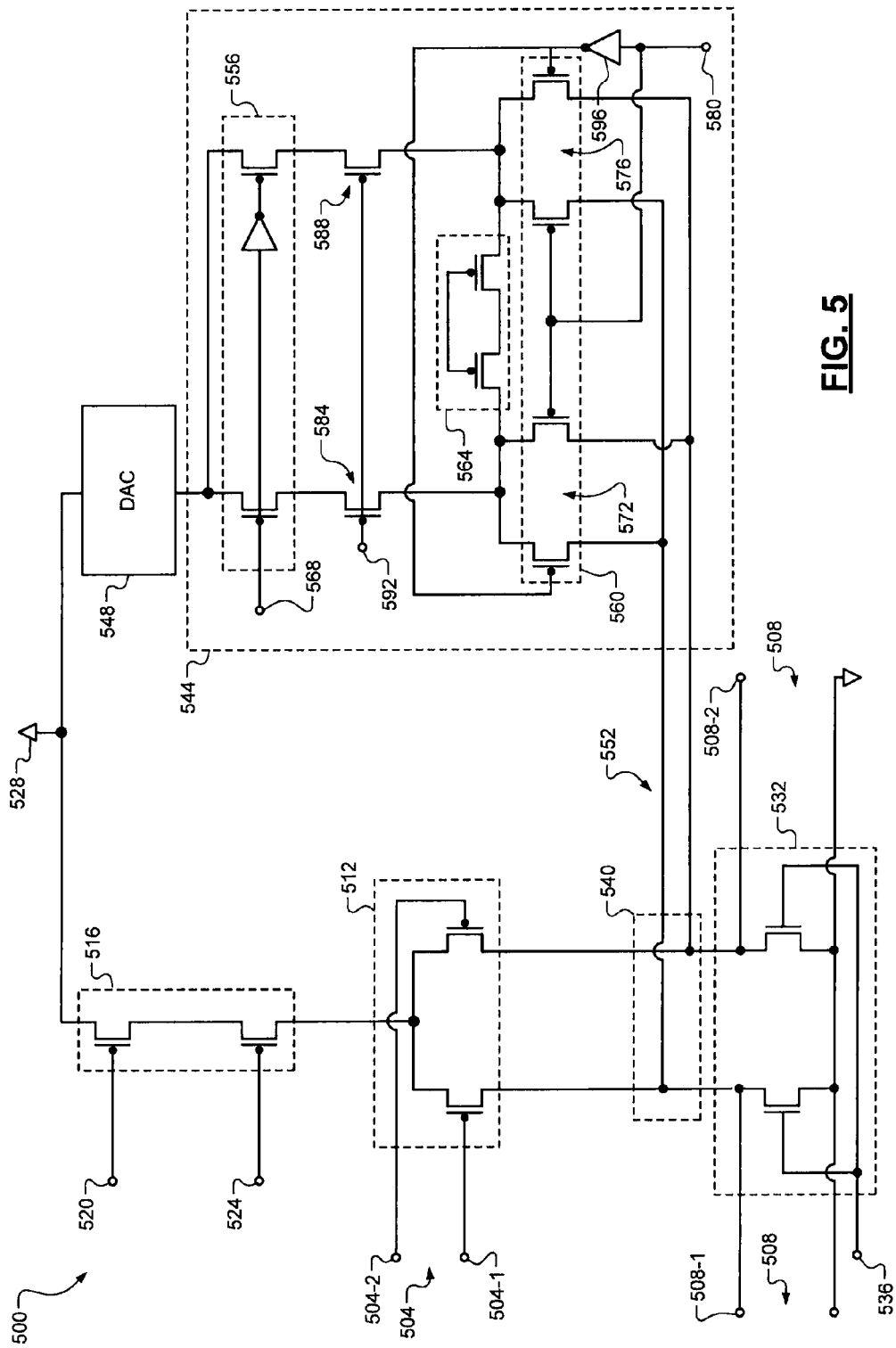
FIG. 5 illustrates a third example high-speed latch according to the principles of the present disclosure.

FIG. 5 shows another example high-speed latch 500. The latch 500 receives a differential analog input signal 504 (e.g., differential inputs 504-1 and 504-2) and generates a differential digital output signal 508 (e.g., differential outputs 508-1 and 508-2). For example, an input amplifier 512 receives the analog input signal 504. A tail current source 516 outputs a current based on a first bias voltage 520, a second bias voltage 524, and a voltage source 528. The input amplifier 512 selectively provides current to an output circuit 532 based on the current received from the tail current source 516 and the analog input signal 504. The output circuit 532 generates the digital output signal 508 based on the current received from the input amplifier 512. The output circuit 532 may include a reset node 536 for resetting the output circuit 532.

The latch 500 also includes an integrated summing node 540 and a summing node output circuit 544. For example, the summing node 540 corresponds to (e.g., replaces) the summer 116 as shown in FIG. 1. The summing node output circuit 544 receives an output of DAC 548 and provides output signals 552 to the summing node 540 accordingly. For example, the DAC 548 may be a current mode or resistive DAC and corresponds to DACs within the DFE module 120 as shown in FIG. 1. The output signals 552 provided by the summing node output circuit 544 to the summing node 540 are independent of data received by the summing node output circuit 544. In other words, the output signals 552 provide data independent charge injection to the summing node 540.

The summing node output circuit 544 includes an analog multiplexer or XOR circuit 556, switch circuit 560, and a common node circuit 564. The analog XOR circuit 556 is used in place of, for example, a digital XOR circuit such as the digital XOR circuit 472 as shown in FIG. 4. The analog XOR circuit 556 communicates with an output of the DAC 548 and receives input 568. The analog XOR circuit 556 operates at a higher rate than a digital XOR circuit and eliminates a propagation delay associated with a digital XOR circuit.

The switch circuit 560 includes symmetric pairs 572 and 576 of high-speed switches. The high-speed switch pairs 572 and 576 of high-speed switches operate according to an input 580 and the output of the DAC 548 (received via the analog XOR circuit 556 and switches 584 and 588, which receive a third bias voltage 592). The input 580 corresponds to $D_{-2}$, or data received two clock cycles prior to the data that is sampled at a next clock edge, and the input 568 corresponds to a sign (i.e., + or −) of a coefficient of the input 580, where the DFE module 120 of FIG. 1 provides, at the summer 116, $V_{in} + \Sigma_{n=1}^{N}(F_n D_{-n})$, where N is a positive integer (e.g., between 2 and 20), and where $F_n$ corresponds to a digital code provided at an input of correspond ones of the DACs of the DFE module 120. The high-speed switch pairs 572 and 576 provide data independent charge injection to the summing node 540 via the output signals 552. In particular, each of the output signals 552 is subject to the same switching operation of respective ones of the high-speed switch pairs 572 and 576, preventing a dynamic offset from being provided to the summing node 540.

Common node circuit 564 (e.g., including a transistor pair) removes any data dependency at a common node of the high-speed switch pairs 572 and 576. In other words, the common node circuit 564 ensures that each of the high-speed switch pairs 572 and 576 does not have data dependent memory (i.e., that the pairs 572 and 576 do not store a particular value to be output via the output signals 552). For example, because one switch of each of the pairs 572 and 576 is biased by the input 580 and the other switch of each of the pairs 572 and 576 is biased by the input 580 as inverted by inverter 596, at least one switch of each of the pairs 572 and 576 is always turned on. Accordingly, a charge stored at the common node of the pairs 572 and 576 is provided to the summing node 540. Connecting the common node circuit 564 between inputs of the respective pairs 572 and 576 prevents the stored charge from causing a data dependent offset.

Figure 6:
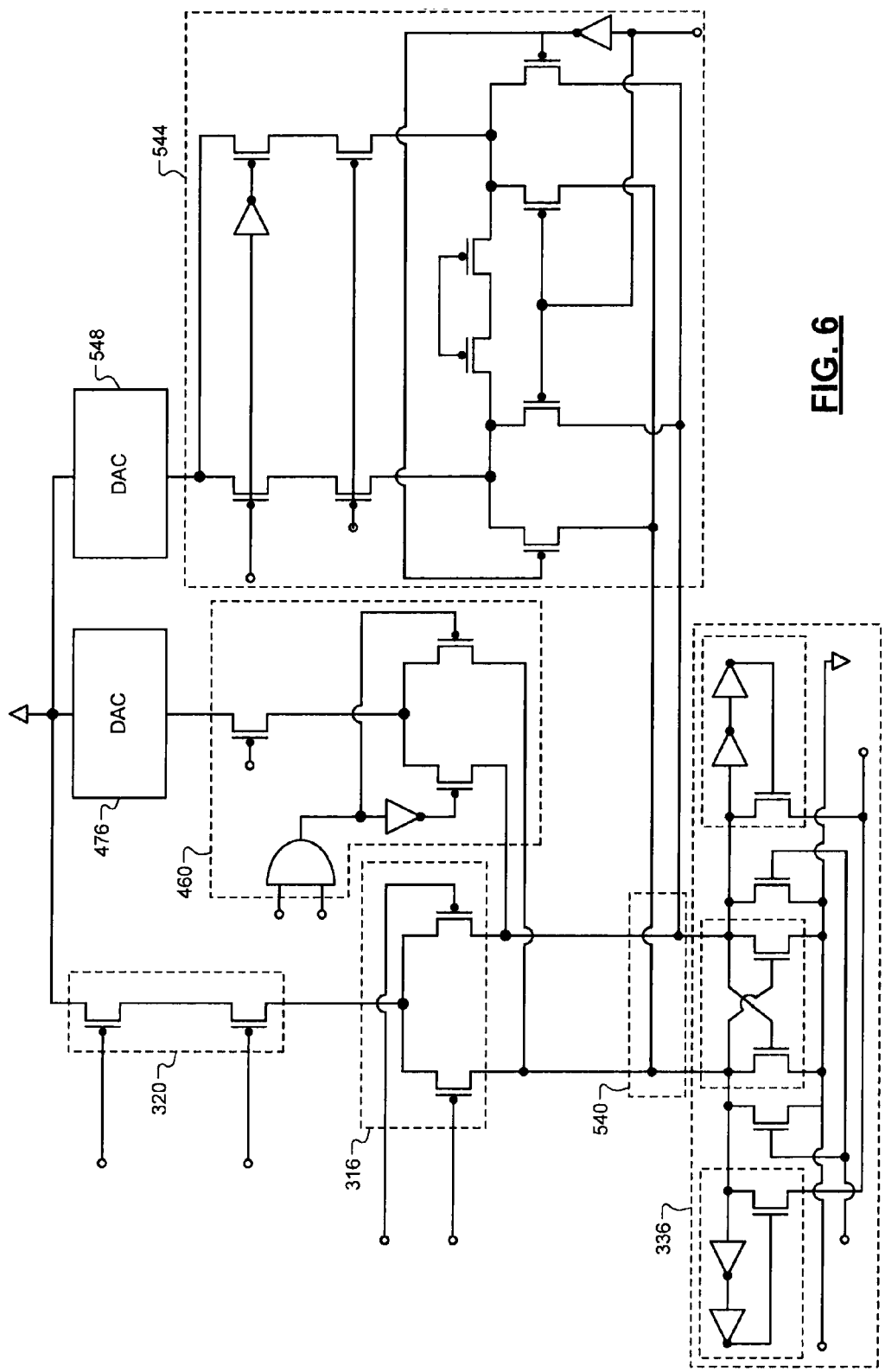
FIG. 6 illustrates a fourth example high-speed latch according to the principles of the present disclosure.

FIG. 6 shows another example latch 600 that incorporates each of the output circuit 336 of FIG. 3, the switch circuit 460 of FIG. 4, and the integrated summing node 540 and summing node output circuit 544 of FIG. 5.

Figure 7:
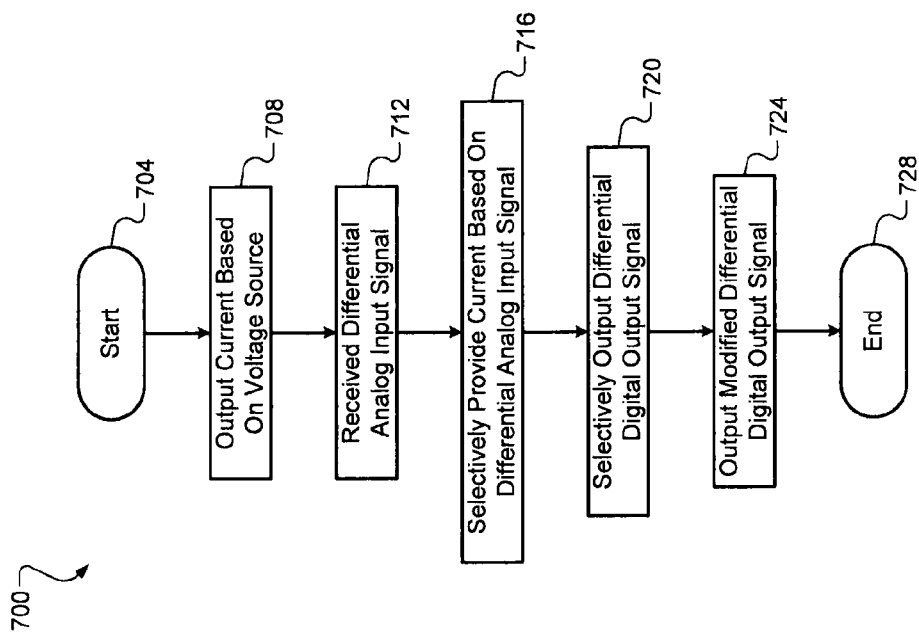
FIG. 7 illustrates steps of an example method of operating a latch according to the principles of the present disclosure.

FIG. 7 shows an example method 700 for operating a latch. The method 700 begins at 704. At 708, a current is output, based on a voltage source, from a current source. At 712, a differential analog input signal is received at an input amplifier. At 716, the input amplifier selectively provides the current output from the current source based on the differential analog input signal. At 720, a latch output circuit selectively outputs, based on the current received from the input amplifier and a voltage source limit, a differential digital output signal. The differential digital output signal includes a first differential output and a second differential output. At 724, an over voltage protection circuit outputs a modified differential digital output signal based on a comparison between a voltage corresponding to each of the first differential output and the second differential output and the voltage source limit. The method 700 ends at 728.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium include nonvolatile memory (such as flash memory), volatile memory (such as static random access memory and dynamic random access memory), magnetic storage (such as magnetic tape or hard disk drive), and optical storage.

The apparatuses and methods described in this application may be partially or fully implemented by one or more computer programs executed by one or more processors. The computer programs include processor-executable instructions that are stored on at least one non-transitory, tangible computer-readable medium. The computer programs may also include and/or rely on stored data.

What is claimed is:

1. A latch, comprising:
   a current source configured to output a current based on a voltage source;
   an input amplifier configured to (i) receive a differential analog input signal including a first differential input and a second differential input, and (ii) selectively provide the current output by the current source based on the first differential input and the second differential input; and
   a latch output circuit configured to selectively output, based on the current received from the input amplifier and a voltage source limit, a differential digital output signal including a first differential output and a second differential output, wherein the latch output circuit comprises
   an over voltage protection circuit configured to (i) receive the current output from the input amplifier, (ii) receive the voltage source limit, (iii) receive feedback of the differential digital output signal as output from the latch output circuit, and (iv) modify the differential digital output signal based on comparisons between
      respective voltages of each of the first differential output and the second differential output as output from the latch output circuit and received by the over voltage protection circuit, and
      the voltage source limit.

2. The latch of claim 1, wherein the over voltage protection circuit comprises:
   a first transistor in communication with (i) the current received from the input amplifier, (ii) the voltage source limit, and (iii) the first differential output; and
   a second transistor in communication with (i) the current received from the input amplifier, (ii) the voltage source limit, and (iii) the second differential output.

3. The latch of claim 2, wherein:
   if the first differential output is less than the voltage source limit, the first differential output corresponds to the current received from the input amplifier;
   if the first differential output is greater than the voltage source limit, the first transistor is configured to limit the first differential output according to the voltage source limit;
   if the second differential output is less than the voltage source limit, the second differential output corresponds to the current received from the input amplifier; and
   if the second differential output is greater than the voltage source limit, the second transistor is configured to limit the second differential output according to the voltage source limit.

4. The latch of claim 3, wherein:
   the first transistor is OFF if the first differential output is less than the voltage source limit; and
   the first transistor is ON if the first differential output is greater than the voltage source limit
   the second transistor is OFF if the second differential output is less than the voltage source limit; and
   the second transistor is ON if the second differential output is greater than the voltage source limit.

5. The latch of claim 2, wherein the over voltage protection circuit further comprises:
   a first buffer amplifier in communication with (i) the current received from the input amplifier, and (ii) the first transistor; and
   a second buffer amplifier in communication with (i) the current received from the input amplifier, and (ii) the second transistor.

6. The latch of claim 1, wherein the over voltage protection circuit further comprises a feedback circuit configured to provide feedback corresponding to the differential digital output signal.

7. The latch of claim 6, wherein the feedback circuit includes a pair of transistors in a cross-coupled arrangement.

8. The latch of claim 1, further comprising:
   a switch circuit connected between an output of a digital-to-analog converter, and (ii) outputs of the input amplifier.

9. A latch, comprising:
   a current source configured to output a current based on a voltage source;

an input amplifier configured to (i) receive a differential analog input signal including a first differential input and a second differential input, and (ii) selectively provide the current output by the current source based on the first differential input and the second differential input;

a latch output circuit configured to selectively output, based on the current received from the input amplifier and a voltage source limit, a differential digital output signal including a first differential output and a second differential output, wherein the latch output circuit comprises an over voltage protection circuit configured to (i) receive the current output from the input amplifier, (ii) receive the voltage source limit, and (iii) modify the differential digital output signal based on comparisons between
respective voltages of each of the first differential output and the second differential output, and
the voltage source limit;

a switch circuit configured to provide an output signal based on an output of a digital-to-analog converter (DAC); and an integrated summing node arranged between the input amplifier and the latch output circuit, the integrated summing node configured to combine (i) the current provided by the input amplifier and (ii) the output signal provided by the switch circuit.

10. The latch of claim 9, further comprising:
an analog XOR circuit arranged between the DAC and the switch circuit.

11. The latch of claim 10, further comprising a common node circuit connected between (i) a first pair of switches of the switch circuit, and (ii) a second pair of switches of the switch circuit.

12. A method of operating a latch, the method comprising:
outputting, from a current source, a current based on a voltage source;
receiving a differential analog input signal including a first differential input and a second differential input;
selectively providing, from an input amplifier, the current output by the current source based on the first differential input and the second differential input;
selectively outputting from the latch, based on the current received from the input amplifier and a voltage source limit, a differential digital output signal including a first differential output and a second differential output;
receiving feedback of the differential digital output signal as output from the latch; and
modifying the differential digital output signal based on comparisons between
respective voltages of each of the first differential output and the second differential output as output from the latch, and
the voltage source limit.

13. The method of claim 12, wherein:
if the first differential output is less than the voltage source limit, the first differential output corresponds to the current received from the input amplifier;
if the first differential output is greater than the voltage source limit, the first differential output is limited according to the voltage source limit;
if the second differential output is less than the voltage source limit, the second differential output corresponds to the current received from the input amplifier; and
if the second differential output is greater than the voltage source limit, the second differential output is limited according to the voltage source limit.

14. The method of claim 12, further comprising providing feedback corresponding to the differential digital output signal.

15. A method of operating a latch, the method comprising:
outputting, from a current source, a current based on a voltage source;
receiving a differential analog input signal including a first differential input and a second differential input;
selectively providing, from an input amplifier, the current output by the current source based on the first differential input and the second differential input;
selectively outputting, based on the current received from the input amplifier and a voltage source limit, a differential digital output signal including a first differential output and a second differential output;
modifying the differential digital output signal based on comparisons between
respective voltages of each of the first differential output and the second differential output, and
the voltage source limit;
providing an output signal based on an output of a digital-to-analog converter (DAC); and
combining (i) the current provided by the input amplifier and (ii) the output signal.

* * * * *